US 9,048,166 B2

(12) United States Patent
Leonard et al.

(10) Patent No.: US 9,048,166 B2
(45) Date of Patent: Jun. 2, 2015

(54) METHOD FOR CONTROLLED GROWTH OF SILICON CARBIDE AND STRUCTURES PRODUCED BY SAME

(71) Applicant: Cree, Inc., Durham, NC (US)

(72) Inventors: Robert Tyler Leonard, Raleigh, NC (US); Hudson M. Hobgood, Pittsboro, NC (US); William A. Thore, Morrisville, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/769,977

(22) Filed: Feb. 19, 2013

(65) Prior Publication Data

US 2013/0153928 A1     Jun. 20, 2013

Related U.S. Application Data

(62) Division of application No. 12/768,960, filed on Apr. 28, 2010, now Pat. No. 8,377,806.

(51) Int. Cl.
| | |
|---|---|
| *H01L 29/16* | (2006.01) |
| *C30B 23/00* | (2006.01) |
| *C30B 29/36* | (2006.01) |
| *C30B 23/02* | (2006.01) |

(52) U.S. Cl.
CPC .......... *H01L 29/1608* (2013.01); *C30B 23/002* (2013.01); *C30B 29/36* (2013.01); *C30B 23/025* (2013.01)

(58) Field of Classification Search
CPC .......................... C30B 23/025; H01L 29/1608
USPC .................................................. 117/2; 257/11
See application file for complete search history.

(56) References Cited

U.S. PATENT DOCUMENTS

| | | |
|---|---|---|
| 5,611,955 A | 3/1997 | Barrett et al. |
| 5,856,231 A | 1/1999 | Niemann et al. |

(Continued)

FOREIGN PATENT DOCUMENTS

| | | |
|---|---|---|
| JP | 2009505833 A | 2/2008 |
| JP | 2009513017 A | 3/2009 |

(Continued)

OTHER PUBLICATIONS

Cree, Inc., International Application No. PCT/US2011/034231, International Preliminary Report on Patentability, Oct. 30, 2012, 9 pages.

(Continued)

*Primary Examiner* — Matthew Reames
(74) *Attorney, Agent, or Firm* — Steven B. Phillips; Moore & Van Allen PLLC (57) ABSTRACT

A method for controlled growth of silicon carbide and structures produced by the method are disclosed. A crystal of silicon carbide (SiC) can be grown by placing a sacrificial substrate in a growth zone with a source material. The source material may include a low-solubility impurity. SiC is then grown on the sacrificial substrate to condition the source material. The sacrificial substrate is then replaced with the final substrate, and SiC is grown on the final substrate. A single crystal of silicon carbide is produced, wherein the crystal of silicon carbide has substantially few micropipe defects. Such a crystal may also include a substantially uniform concentration of the low-solubility impurity, and may be used to make wafers and/or SiC die.

12 Claims, 4 Drawing Sheets

(56) References Cited

U.S. PATENT DOCUMENTS

| | | | |
|---|---|---|---|
| 7,497,906 B2 | 3/2009 | Kondo et al. | |
| 7,520,930 B2 | 4/2009 | Kusunoki et al. | |
| 7,553,373 B2 | 6/2009 | Otsuki et al. | |
| 7,563,321 B2 | 7/2009 | Powell et al. | |
| 2003/0070611 A1* | 4/2003 | Nakamura et al. | 117/109 |
| 2004/0000266 A1* | 1/2004 | D'Evelyn et al. | 117/2 |
| 2007/0262322 A1 | 11/2007 | Nakabayashi et al. | 257/77 |
| 2010/0295059 A1* | 11/2010 | Fujimoto et al. | 257/77 |

FOREIGN PATENT DOCUMENTS

| | | |
|---|---|---|
| JP | 2009234802 A | 10/2009 |
| WO | 2006011976 A1 | 2/2006 |
| WO | 2006017074 A2 | 2/2006 |
| WO | 2006017074 A3 | 2/2006 |
| WO | 2006041067 A1 | 4/2006 |

OTHER PUBLICATIONS

Cree, Inc., International Application No. PCT/US2011/034231, International Search Report and Written Opinion, Jul. 4, 2011, 14 pages.

Nakamura, D., et al, Ultrahigh-quality silicon carbide single crystals, Aug. 26, 2004, Nature, vol. 430, pp. 1009-1012.

Shiomi, H., et al., Crystal growth of micropipe free 4H-SiC on 4H-SiC{0 3 3 8} seed and high-purity semi-insulating 6H-SiC, Journal of Crystal Growth, 2006, vol. 292, pp. 188-191.

Chao, W., et al, A Compensation Mechanism for Semi-Insulating 6H-SiC Doped with Vanadium, Journal of Semiconductors, Feb. 2008, vol. 29, No. 2, pp. 206-209.

Ning, L., et al, Vanadium-Doped Semi-Insulating 6H-SiC for Microwave Power Device Applications, Journal of Materials Science and Technology, 2009, vol. 25, No. 1, pp. 102-104.

J.R. Jenny et al., Deep level transient spectroscopic and Hall effect investigation of the position of the vanadium acceptor level in 4H and 6H SiC, Apr. 1, 1996, Appl. Phys. Lett. 68.

H. MCD. Hobgood, et al., Semi-insulating 6H-SiC grown by physical vapor transport, Mar. 13, 1995, Appl. Phys. Lett. 66.

J.S. Sullivan, et al., 6H-SiC Photoconductive Switches Triggered at Below Bandgap Wavelengths, University of California Lawrence Livermore National Laboratory, Feb. 22, 2007.

M. Bickermann, et al., Preparation of Semi-Insulating Silicon Carbide by Vanadium Doping during PVT Bulk Crystal Growth, http://www.scientific.net, 2003.

Cree, Inc., Japanese Application No. 2013-508234, Office Action, Oct. 29, 2013.

Cree, Inc., Japanese Application No. 2013-508234, Decision of Rejection, Sep. 11, 2014.

* cited by examiner

METHOD FOR CONTROLLED GROWTH OF SILICON CARBIDE AND STRUCTURES PRODUCED BY SAME

CROSS-REFERENCES

This application is a divisional application of U.S. patent application Ser. No. 12/768,960, filed Apr. 28, 2010, now U.S. Pat. No. 8,377,806, the contents of which are incorporated herein by reference.

BACKGROUND

Silicon carbide (SiC) exhibits many attractive electrical and thermophysical properties. Silicon carbide is especially useful due to its physical strength and high resistance to chemical attack. Silicon carbide also has excellent electronic properties, including radiation hardness, high breakdown field, a relatively wide band gap, high saturated electron drift velocity, high temperature operation, and absorption and emission of high energy photons in the blue, violet, and ultraviolet regions of the spectrum. Some of the properties of SiC make it suitable for the fabrication of high power density solid state devices.

SiC is often produced by a seeded sublimation growth process. In a typical silicon carbide growth technique, a substrate and a source material are both placed inside of a reaction crucible. A thermal gradient created when the crucible is heated encourages vapor phase movement of the materials from the source material to the substrate followed by condensation upon the substrate and resulting bulk crystal growth.

For many applications it is desirable that the crystal have high-electrical resistivity. It is known that impurities can be introduced as dopants into SiC and that these dopants can regulate certain properties including the electrical resistivity. If the SiC is produced in a sublimation growth process as discussed immediately above, a dopant can be introduced into the chamber in any of various ways so that the dopant will be present in the SiC crystal produced from that process. The process is controlled to provide an appropriate concentration of the dopant for a particular application.

SUMMARY

Embodiments of the present invention provide a method of growing semi-insulating silicon carbide (SiC) with relatively few micropipe defects. Micropipe defects can be caused by precipitation of a low-solubility impurity, and are often simply referred to as "micropipes." Embodiments of the invention can provide SiC structures such as bulk crystals, wafers, and devices for applications where semi-insulating SiC is desirable, for example, photoconductive switches. Photoconductive material should be normally insulating in order to support high voltage but be optically excitable to become conductive, and therefore allow fast coordinated switching for high-voltage applications. Embodiments of the present invention provide for a two-part growth process for SiC crystals, which minimizes precipitation of a low-solubility dopant, for example, vanadium.

In some embodiments, a crystal of SiC is grown by placing a sacrificial substrate in a growth zone with source material. The growth zone may, as an example, be the inside of a reaction crucible, which is in turn placed in a heated chamber. In such an example, physical vapor transport (PVT) may be used to grow the SiC crystal. SiC is grown on the sacrificial substrate to condition the source material. In some embodiments, the source material includes a low-solubility impurity and growth takes place until past the point where precipitation of the low-solubility impurity ends in the SiC on the sacrificial substrate. The sacrificial substrate is then replaced with a final substrate, and SiC is grown on the final substrate using at least the source material. A single crystal of silicon carbide is produced. In some embodiments, the crystal of silicon carbide includes a substantially uniform concentration of the low-solubility impurity. The crystal can be any of various polytypes, for example, 6H, 4H, 15R and 3C.

In some embodiments of the invention, the low-solubility impurity is selected from periodic groups IB, IIB, IIIB, IVB, VB, VIB, VIIB, VIIIB and IIIA. In some embodiments, the low-solubility impurity is vanadium. In some embodiments, the low-solubility impurity is chromium. In embodiments where the low-solubility impurity is vanadium, the concentration of vanadium can be greater than $1 \times 10^{15}$ cm$^{-3}$. To realize the benefit of the full range of possible concentration of the low-solubility impurity, it may be necessary to maintain a very low concentration of background impurity in the crystal. In embodiments where the low-solubility impurity is vanadium, the crystal can be doped with a second impurity. In some embodiments, nitrogen can serve as the second impurity. In embodiments where vanadium and nitrogen are used, the crystal can be doped such that the vanadium has a concentration of at least $5 \times 10^{16}$ cm$^{-3}$ and a vanadium to nitrogen ratio having a value from about 1 to a value of about 3 is maintained over at least a portion of the crystal length.

Embodiments of the invention can produce SiC crystals with low micropipe densities, and/or significant micropipe free areas. In some embodiments, a bulk crystal is produced with a dimension of at least 50 mm, and with a plurality of 10 mm×10 mm×1 mm volumes, each with less than or equal to 5 micropipes. In some embodiments, the bulk crystal has a plurality of geometric volumes, each with a volume of 100 mm$^3$ and with less than or equal to 5 micropipes. The crystal can be cut into silicon carbide wafers. In some embodiments, wafers with a thickness of at least 50 µm are produced. In some embodiments, these wafers then have a dimension of at least 50 mm and a thickness of at least 50 µm, and have a plurality of 1 mm$^3$ micropipe free volumes through at least 35% of the silicon carbide wafer. Wafers made according to an embodiment of the invention can be cut into die, where a die can be used to form a device. As an example, a photoconductive switch can be produced in this manner.

In some embodiments, die for use in devices can be produced from a wafer, from a crystal, or in other ways. A silicon carbide die in at least some embodiments is substantially micropipe free and has dimensions of at least 10 mm×10 mm×1 mm. In some embodiments, the die is doped with vanadium at a concentration of greater than or equal to $5 \times 10^{16}$ cm$^{-3}$, and with nitrogen such that a vanadium to nitrogen ratio having a value from approximately 1 to a value of approximately 3 is maintained over the die.

BRIEF DESCRIPTION OF THE DRAWINGS

FIG. 1 illustrates a method of producing a crystal and a crystal being grown according to example embodiments of the invention. For clarity, FIG. 1 is shown in three parts on three sheets as FIG. 1A, FIG. 1B, and FIG. 1C.

DETAILED DESCRIPTION

The following detailed description refers to the accompanying drawings, which illustrate specific embodiments of the invention. Other embodiments having different structures and operation do not depart from the scope of the present invention.

Embodiments of the present invention provide for the production of low-solubility impurity doped silicon carbide (SiC) in the form of a semi-insulating crystal for applications such as high-voltage switching, photo-switching, and use as an electrically passive substrate. The concentration of the low-solubility impurity(ies) in the crystal is substantially uniform over at least a substantial portion of the crystal's length. A variety of polytypes of SiC can be used. For example, 6H, 4H, 15R and 3C polytypes can be used. A variety of low-solubility impurities can be used as a dopant. An impurity from periodic groups IB, IIB, IIIB, IVB, VB, VIB, VIIB, VIIIB or IIIA can be used. For example, vanadium or chromium can be used. In some embodiments, doping includes compensation by another impurity. For example, nitrogen can be used as the second impurity.

In example embodiments described herein, vanadium (V) and nitrogen (N) are used as dopants for a 6H SiC crystal with semi-insulating properties. This crystal is grown from SiC source material in a crucible using a physical vapor transport process. The SiC source material in the crucible can be provided in any of various forms, including but not limited to solid, powder, or gas. The resulting crystal can have a concentration of vanadium that remains between $8.3 \times 10^{16}$ and $3.3 \times 10^{17}$ cm$^{-3}$ over a crystal length of up to 17 mm. The crystal can have a concentration of nitrogen that remains between $6.0 \times 10^{16}$ and $1.2 \times 10^{17}$ cm$^{-3}$ over the same distance. It cannot be overemphasized that this embodiment is but one example of how an embodiment of the present invention might be implemented.

Precipitation of a low-solubility impurity such as vanadium can occur in SiC when the concentration of the impurity exceeds the solubility limit of the impurity. Precipitation is usually accompanied by depletion of the impurity along the length of a crystal. Precipitation of the impurity makes the distribution of the dopant in the final crystal non-uniform and also causes high pipe density, also referred to as a high density of micropipes or micropipe defects. Micropipes are essentially tiny, tubular voids within the crystal structure.

In example embodiments of the invention, precipitation is avoided using a two-part growth process. In the example of vanadium and nitrogen doping, excess vanadium is allowed to precipitate into a sacrificial layer of SiC grown on a sacrificial substrate during the first part of the process. This first part of the process may condition the material in the crucible, be it source material or material from the crucible itself, in order to prevent further precipitation. The sacrificial substrate is then supplanted with the final substrate upon which the final crystal is grown in the second part of the process. During this second part of the process, the crystal is doped with nitrogen at a concentration less than the concentration of vanadium so as to achieve a total compensation of the nitrogen by the vanadium. The nitrogen can be introduced into the crucible as a gas. The absence of precipitation resulting from the use of the conditioned material results in more uniform concentration of the dopants and reduced densities of micropipes. In some embodiments, the concentration of vanadium varies by no more than one decade per centimeter, or less than an order of magnitude.

Figure 1A:
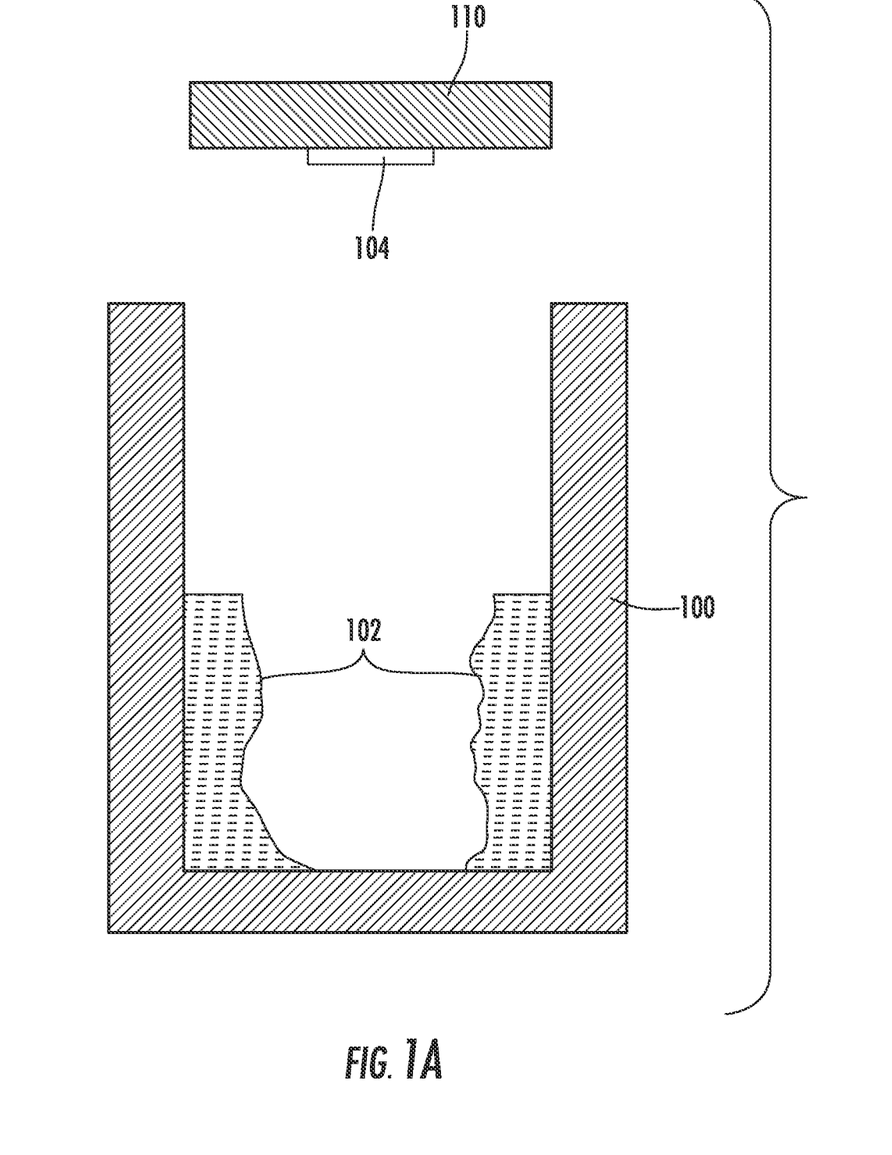

FIG. 1 illustrates the process of growing a crystal according to an example embodiment of the invention, wherein vanadium is the low-solubility impurity. In FIG. 1A, crucible 100 contains SiC source material 102. In this example, the interior of the crucible serves as a growth zone. Source material 102 is doped with vanadium. A sacrificial substrate 104 is fixed to crucible lid 110. The lid with the sacrificial substrate is placed on crucible 100 so that the substrate is suspended in the crucible above the source material, and crucible 100 is heated.

Figure 1B:
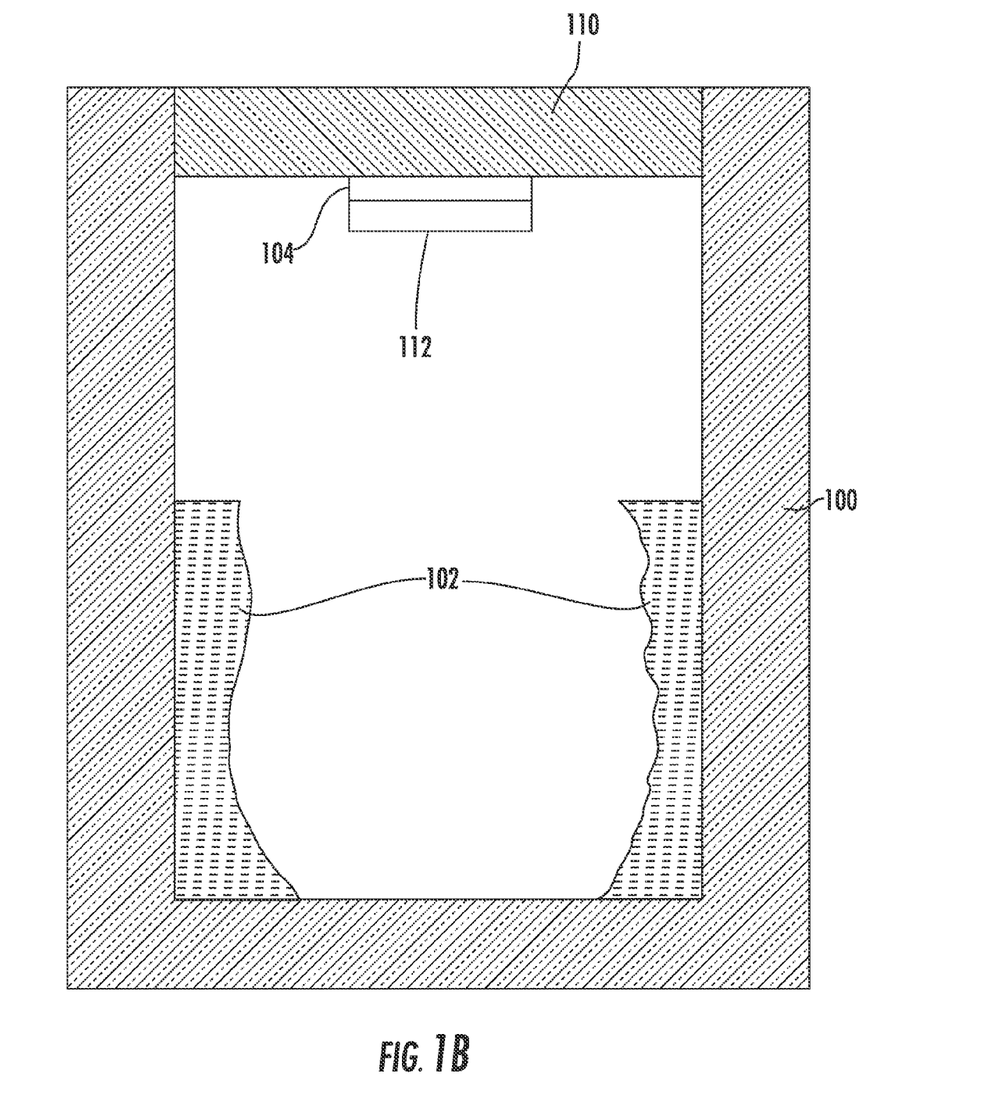

Turning to FIG. 1B, crystal growth takes place until grown crystal 112 reaches a point past where precipitation of vanadium ends. The source material 102 below is now conditioned appropriately to match the thermal profile of the system. The initial source material has evolved and come into stoichiometric equilibrium. The point where the growth of crystal 112 should be stopped will vary according to such parameters as the size and type of crucible and the vanadium concentration in source material 102. However, this point can be determined in advance through sacrificial growths coupled with examination of crystal 112 for precipitation of the impurity. As an example, crystal 112 can reach a length of several millimeters.

Figure 1C:
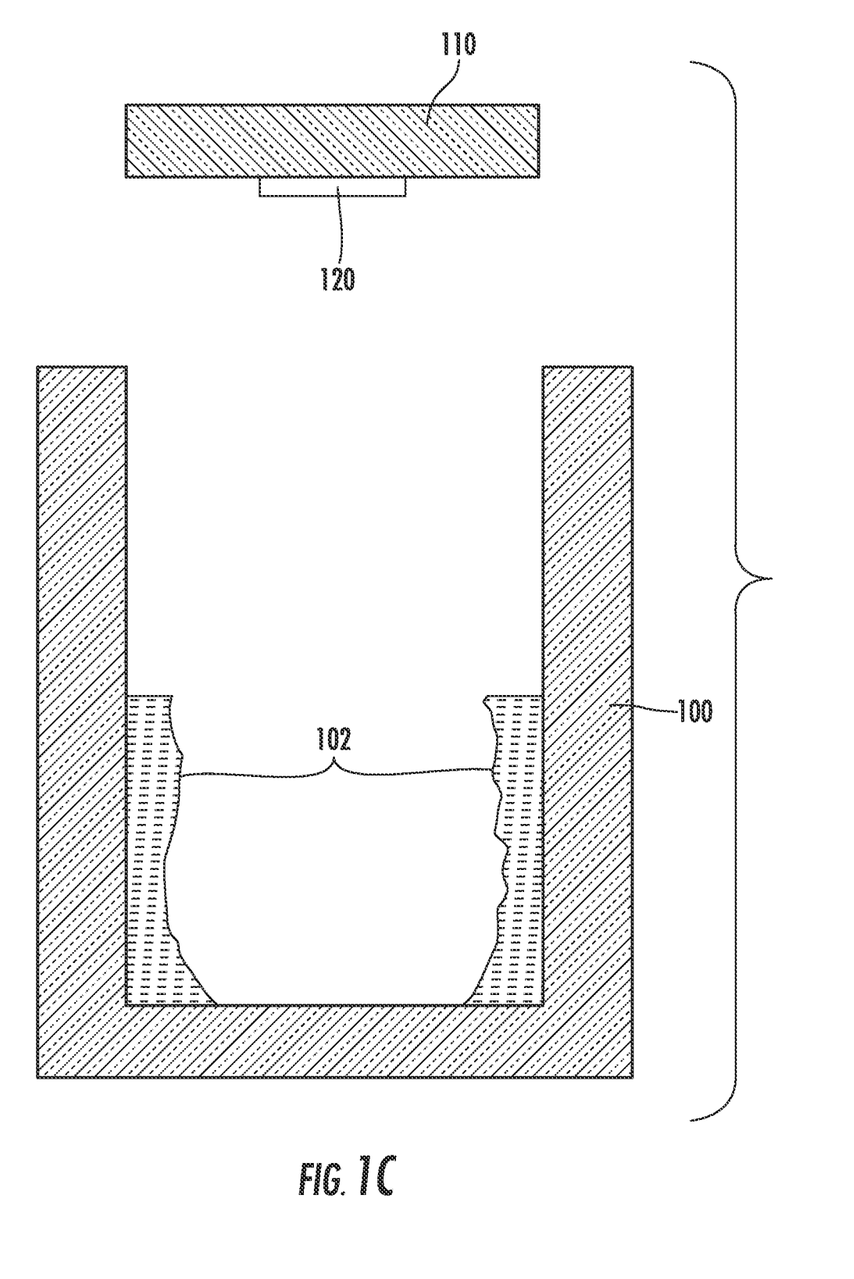

In FIG. 1C, the sacrificial substrate has been discarded, and final substrate 120 has been fixed to crucible lid 110. At this point, the compensating dopant, in this example nitrogen, is introduced into the system. The compensating dopant can be introduced as a gas. Growth on the final substrate is initiated, and the final SiC crystal is produced. The conditioning of the source material and/or the crucible material allows for a more stoichiometrically uniform flux to evolve from the source material, and a controlled doping profile is realized. For purposes of this description, the term "source material" may refer to source material initially placed in the growth zone, or source material which includes or may include material from the crucible itself if the growth zone is the inside of a crucible.

Depending on the specific system parameters, V-doped SiC crystal produced as described above can result in a crystal where the concentration of vanadium is greater than $1 \times 10^{15}$ cm$^{-3}$. In some embodiments, the concentration of vanadium may be greater than $5 \times 10^{15}$ cm$^{-3}$. In some embodiments, the concentration of vanadium may be greater than $1 \times 10^{16}$ cm$^{-3}$. In some embodiments, the crystal can be doped such that the vanadium has a concentration of at least $5 \times 10^{16}$ cm$^{-3}$ and a vanadium to nitrogen ratio having a value from approximately 1 to a value of approximately 3 is maintained over at least a portion of the crystal length. To realize the benefit of the full range of possible concentration of the low-solubility impurity, it may be necessary to maintain a very low concentration of background impurity in the crystal. This can be done using high-purity input techniques such as baking, washing, gettering, chemical purification, and the maintenance of a clean environment.

In example embodiments, a crystal with low micropipe density, and/or significant micropipe free areas is produced. In some embodiments, a bulk crystal can be produced with a dimension of at least 50 mm, and with a plurality of 10 mm×10 mm×1 mm volumes, each with less than or equal to 5 micropipes. In some embodiments, the bulk crystal can have a plurality of at least 100 mm$^3$ volumes, each volume with less than or equal to 5 micropipes. In some embodiments, the number of micropipes in a volume may be less than or equal to 3 micropipes.

The crystal can be cut into silicon carbide wafers. In some embodiments, wafers with a thickness of at least 50 μm are produced. In some embodiments, these wafers then have a dimension of at least 50 mm and a thickness of at least 50 μm, and also have a plurality of 1 mm$^3$ micropipe free volumes through at least 35%, 40%, 45% or 50% of the silicon carbide wafer.

Figure 2:
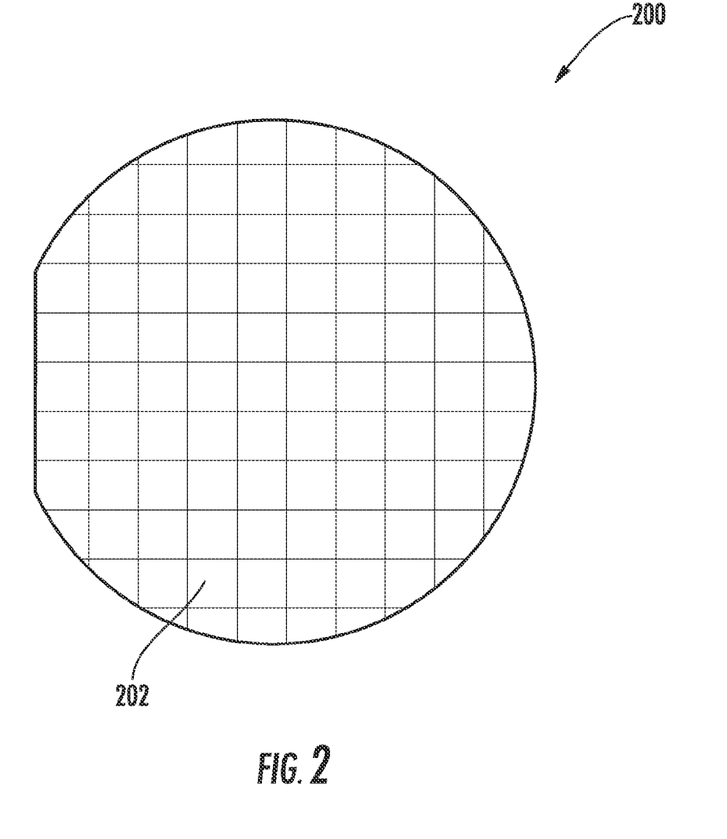
FIG. 2 illustrates an example wafer according to embodiments of the present invention. The wafer of FIG. 2 also illustrates the die that would be cut from the wafer to form devices according to example embodiments of the invention.

FIG. 2 is a schematic illustration of a substantially circular wafer cut from a crystal made according to an embodiment of the invention. Wafer 200 can be cut into die, wherein a die 202 can be used to form a device. As an example, a photoconductive switch can be produced in this manner. Further processing, including, but not limited to, the depositing of additional layers of semiconductor material prior to cutting the wafer may be necessary to form working devices. To be put into use, a finished device may also need to be encapsulated in a package with appropriate contacts for mounting and/or connection within a circuit.

Figure 3:
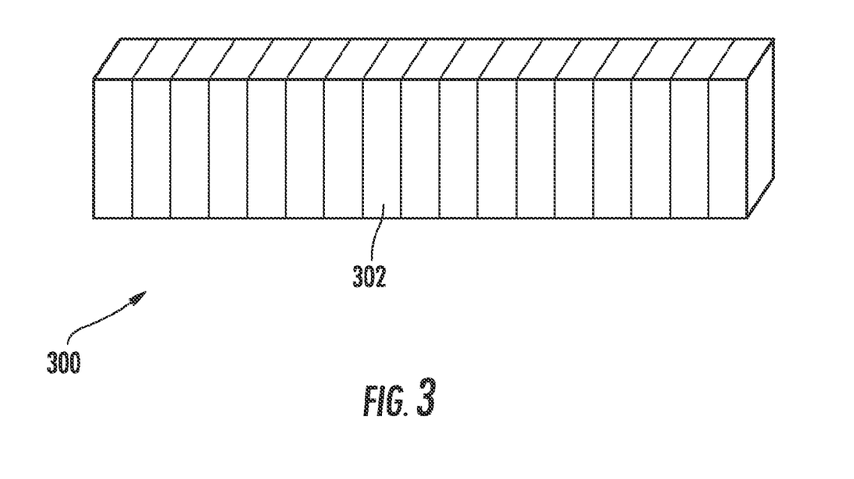
FIG. 3 illustrates another example wafer according to embodiments of the present invention. The wafer of FIG. 3 also illustrates the die that would be cut from the wafer to form devices according to example embodiments of the invention.

FIG. 3 is a schematic illustration of a substantially rectangular wafer cut from a crystal made according to an embodiment of the invention. Wafer 300 can again be cut into die, wherein a die 302 can be used to form a device. Wafers according to an embodiment of the invention can be of various shapes and sizes.

In example embodiments, a die for use as a device can be produced from a wafer, from a crystal, or in other ways. A silicon carbide die in at such an embodiment can be substantially micropipe free and have dimensions of at least 10 mm×10 mm×1 mm. In some embodiments, the die is doped with vanadium at a concentration of greater than or equal to $5\times10^{16}$ cm$^{-3}$, and with nitrogen such that a vanadium to nitrogen ratio having a value from approximately 1 to a value of approximately 3 is maintained over the die.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Additionally, comparative, quantitative terms such as "less" and "greater", are intended to encompass the concept of equality, thus, "less" can mean not only "less" in the strictest mathematical sense, but also, "less than or equal to."

It should also be pointed out that references may be made throughout this disclosure to figures and descriptions using terms such as "above", "below", "within", "on", and other terms which imply a relative position of a structure or portion. These terms are used merely for convenience and refer only to the relative position of features as shown from the perspective of the reader. An element that is placed or disposed atop another element in the context of this disclosure can be functionally in the same place in an actual product but be beside or below the other element relative to an observer due to the orientation of a device or equipment. Any discussions which use these terms are meant to encompass various possibilities for orientation and placement.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. A silicon carbide crystal having a substantially uniform concentration of a low-solubility impurity, a substantially uniform ration from about 1 to about 3 of the low-solubility impurity to second impurity, a dimension of at least 50 mm, and a plurality of geometric volumes, each a volume of 100 mm$^3$ with less than or equal to 5 micropipes the silicon carbide crystal formed by a process comprising:
    placing a sacrificial substrate in a chamber with a source material including the low-solubility impurity;
    growing silicon carbide on the sacrificial substrate;
    replacing the sacrificial substrate with a final substrate; and
    growing silicon carbide on the final substrate using at least the source material to produce a silicon carbide crystal wherein the concentration of the low-solubility impurity varies by no more than on decade per centimeter.

2. The silicon carbide crystal of claim 1 wherein the low-solubility impurity comprises vanadium.

3. The silicon carbide crystal of claim 2 wherein the second impurity comprises nitrogen.

4. The silicon carbide crystal of claim 3 wherein the vanadium has a concentration of at least $5\times10^{16}$ cm$^{-3}$.

5. A semi-insulating, silicon carbide crystal having a dimension of at least 50 mm of a polytype selected from a group consisting of 6H, 4H, 15R and 3C, the semi-insulating, silicon carbide crystal comprising:
    a substantially uniform concentration of a low-solubility impurity corresponding to no more than one decade per centimeter of variation, the low-solubilty impurity selected from one of periodic groups IB, IIB, IIIB, IVB, VB, VIB, VIIB, VIIIB and IIIA, with a substantially uniform ratio from about 1 to about 3 of the low-solubility impurity to a second impurity; and
    a plurality of 10 mm×10 mm×1 mm volumes with less than or equal to 5 micropipes.

6. The semi-insulating, silicon carbide crystal of claim 5 wherein the low-solubility impurity is one of vanadium and chromium.

7. The semi-insulating, silicon carbide crystal of claim 5 wherein the low-solubility impurity comprises vanadium at a concentration of greater than $1\times10^{15}$ cm$^{-3}$.

8. The semi-insulating, silicon carbide crystal of claim 5 wherein the low-solubility impurity comprises vanadium at a concentration of greater than or equal to $5\times10^{16}$ cm$^{-3}$, and the second impurity comprises nitrogen.

9. A semi-insulating, silicon carbide crystal having a dimension of at least 50 mm of a polytype selected from a group consisting of 6H, 4H, 15R and 3C, the semi-insulating, silicon carbide crystal comprising:
    a substantially uniform concentration of a low-solubility impurity corresponding to no more than one decade per centimeter of variation, the low solubility impurity selected from one of periodic groups IB, IIB, IIIB, IVB, VB, VIB, VIIB, VIIIB and IIIA, with a substantially uniform ration from about 1 to about 3 of the low solubility impurity to a second impurity; and
    a plurality of 100 mm$^3$ volumes with less than or equal to 5 micropipes.

10. The semi-insulating, silicon carbide crystal of claim 9 wherein the low-solubility impurity is one of vanadium and chromium.

11. The semi-insulating, silicon carbide crystal of claim 9 wherein the low-solubility impurity comprises vanadium at a concentration of greater than $1\times10^{15}$ cm$^{-3}$.

12. The semi-insulating, silicon carbide crystal of claim 9 wherein the low-solubility impurity comprises vanadium at a concentration of greater than or equal to $5 \times 10^{16}$ cm$^{-3}$, and the second impurity comprises nitrogen.

\* \* \* \* \*

UNITED STATES PATENT AND TRADEMARK OFFICE
CERTIFICATE OF CORRECTION

PATENT NO. : 9,048,166 B2
APPLICATION NO. : 13/769977
DATED : June 2, 2015
INVENTOR(S) : Robert Tyler Leonard et al.

It is certified that error appears in the above-identified patent and that said Letters Patent is hereby corrected as shown below:

IN THE CLAIMS:

In column 6, claim 1, please change line 7 to:

"uniform ratio from about 1 to about 3 of the low-solubility"

In column 6, claim 1, please change line 8 to:

"impurity to a second impurity, a dimension of at least 50 mm,"

In column 6, claim 1, please change line 10 to:

"$mm^3$ with less than or equal to 5 micropipes, the silicon car-"

In column 6, claim 1, please change line 19 to:

"varies by no more than one decade per centimeter."

In column 6, claim 5, please change line 32 to:

"centimeter of variation, the low-solubility impurity"

In column 6, claim 9, please change line 58 to:

"uniform ratio from about 1 to about 3 of the low-solu-"

Signed and Sealed this
Thirteenth Day of October, 2015

Michelle K. Lee
*Director of the United States Patent and Trademark Office*